United States Patent [19]

Kenney

[11] Patent Number: 5,710,057
[45] Date of Patent: Jan. 20, 1998

[54] SOI FABRICATION METHOD

[76] Inventor: Donald M. Kenney, 18 Birch Rd., Shelburne, Vt. 05482

[21] Appl. No.: 679,021

[22] Filed: Jul. 12, 1996

[51] Int. Cl.$^6$ .................................................. H01L 21/76
[52] U.S. Cl. ........................... 437/62; 437/86; 437/974; 148/DIG. 12; 117/915
[58] Field of Search ........................... 437/62, 86, 974; 148/DIG. 12, DIG. 135; 156/629.1; 117/915

[56] References Cited

U.S. PATENT DOCUMENTS

| | | |
|---|---|---|
| 3,332,137 | 7/1967 | Kenney . |
| 4,445,965 | 5/1984 | Milnes . |
| 4,475,980 | 10/1984 | Rhemer et al. . |
| 4,883,561 | 11/1989 | Gmitter . |
| 5,362,682 | 11/1994 | Bozler et al. . |
| 5,641,381 | 6/1997 | Bailey et al. . |

OTHER PUBLICATIONS

Yablonovitch et al., "Extreme Selectivity in the Lift-off of Epitaxial GaAs Films," Appl. Phys. Lett., 51 (26), Dec. 28, 1987, pp. 2222–2224.

Fan, "Thin Films of III-V Compounds and Their Applications," Journal de Physique, 43, Oct., 1982, pp. C1–327 to C1–339.

Bruel et al., "® Smart Cut: A Promising New SOI Material Technology," IEEE International SOI Conference, Oct., 1995, pp. 178–179.

Sato et al., "High–Quality Epitaxial Layer Transfer (ELT-RAN) by Bond and Etch–Back of Porous Si," IEEE International SOI Conference, Oct., 1995, pp. 176–177.

Alles et al., "Advanced Manufacturing of SIMOX for Low Power Electronics," Solid State Electronics, vol. 39, No. 4, 1996, pp. 499–504.

Yonehara et al., "Epitaxial Layer Transfer by Bond and Etch Back of Porous Si," Appl. Phys. Lett., 64 (16), 18 Apr., 1994, pp. 2108–2110.

Sato et al., "Epitaxial Growth on Porous Si for a New Bond and Etchback Silicon–on–Insulator," J. Electrochem. Soc., vol. 142, No. 9, Sep., 1995, pp. 3116–3122.

Kolthoff et al., "Treatise on Analytical Chemistry," Part II, vol. I, 1961, pp. 49 and 53.

Dumke et al., "GaAs–GaAlAs Heterojunction Transistor for High Frequency Operation," Solid State Electronics, vol. 15, 1972, pp. 1339–1343.

Tsao et al., "Selective Porous Silicon Formation in Buried P+ Layers," J. Appl. Phys., 62 (10), Nov. 15, 1987, pp. 4182–4186.

Kemlage et al., "Total Dielectric Isolation," IBM Technical Disclosure Bulletin, vol. 24, No. 11B, Apr. 1982, pp. 6008–6009.

*Primary Examiner*—George R. Fourson

[57] ABSTRACT

A first region of a seed substrate is separated from a bonded handle substrate by etching and/or fracturing a second region of the seed substrate. A third region of the seed substrate remains bonded to the handle wafer. Etching and etch ant distribution are facilitated by capillary action in trenches formed in the seed substrate prior to bonding of the handle substrate. A portion of the second region may be removed by undercut etching prior to handle bonding. Elevated pressure and etchant composition are used to suppress bubble formation during etching. Alternatively, pressure from bubble formation is used to fracture a portion of the second region. First, second, and third regions are defined by a variety of methods.

20 Claims, 5 Drawing Sheets

5,710,057

SOI FABRICATION METHOD

FIELD OF INVENTION

This invention applies particularly to separation of a semiconductor seed substrate from a portion of the seed substrate that has been bonded to a handle substrate. The method is generally applicable to other materials and purposes as well.

BACKGROUND OF THE INVENTION

The semiconductor industry has long sought methods to construct "Silicon on Insulator", or SOI structures. The methods have also been applied to other semiconductor materials, thus making the SOI acronym applicable to very general "Semiconductor on Insulator" and "Semiconductor on Semiconductor" concepts. Interest in SOI methods has been driven by an ever present need to improve the electronic performance of semiconductor devices, including solar cells. Unfortunately, both cost and quality limitations have prevented SOI technology from achieving a major market share. Thus a need still exists for improved SOI methods.

U.S. Pat. No. 3,332,137 "Method of Isolating Chips of a Wafer of Semiconductor Material", issued Jul. 25, 1967 to Kenney, describes an SOI technique developed early in the history of the industry. The method provides high quality single crystal epitaxial material of precise thickness bonded to an oxide layer on a poly crystalline silicon substrate. Bonded layers still provide SOI of the best available crystal defect quality, even after 30 years of alternative developments. However, bonding methods generally have consumed two substrates, now usually known as the seed substrate and the handle substrate, to produce a single SOI substrate. The seed substrate itself is destroyed in the SOI fabrication process when it is mechanically or chemically removed from the bonded structure. Thus the basic SOI wafer cost includes the cost of two substrates plus the cost of processes employed.

U.S. Pat. No. 4,883,561 "Lift-off and Subsequent Bonding of Epitaxial Films" issued Nov. 28, 1989 to Gmitter et al., describes a lift-off technique in which the seed wafer is kept intact for reuse as a new seed wafer, thus eliminating much of the cost of the seed substrate. However, they have indicated use of the method has been limited to substrates of less than two square centimeters in size. The method seems very unlikely to be applicable to normal semiconductor wafer sizes which are now 20 centimeters diameter, and expected to increase to 30 centimeters. The process has also been described in "Extreme Selectivity in the Lift-off of Epitaxial GaAs Films", by Yablonovitch et al., Appl. Phys. Lett. 51 (26), Dec. 28, 1987, pp. 2222–2224. An epitaxial film is freed from a single crystal substrate by selectively etching away a thin release layer positioned between the film and substrate, and causing the edges of the film to curl upward as the release layer is etched, so as to enhance diffusion of reaction products away from the active etching area. Curling of the released film to open a path for escape of reaction products is critical to the method. Curling of the film also opens a path for fresh reactant to reach the active etching interface. In the absence of curling, the etching action will stop because of bubble formation by gaseous reaction products, and because of depletion of the etchant near the etching interface. Curling of the film seems to introduce mechanical limitations that constrain the size of the substrate that can be utilized. Cracking of the curled film due to bubble pressure is reported when the etch rate is too rapid.

In "Thin Films of III–V Compounds and Their Applications", Journal de Physique, 43, Oct., 1982, pp. C1-327 thru C1-339, Fan describes a method of cleaving a GaAs film from a GaAs substrate to form a bonded SOI structure. The technique involves epitaxial overgrowth of the film on a masked seed substrate to form a continuous epitaxial film over the masked substrate. The continuous film is then bonded to a handle wafer and cleaved from the seed substrate. The mask layer on the seed substrate acts as a release layer and is described as "the key element" of the process. The area of the cleaved film is indicated to be only about four square centimeters.

In "® SMART CUT: A Promising New SOI Material Technology", IEEE Int. SOI Conf. Proc., Oct 1995, pp. 178–179, Bruel et al. describe a bonded SOI technique in which a seed wafer (wafer A) is ion implanted with hydrogen. The seed wafer is then bonded to a handle wafer (wafer B). Next a heat treatment causes the seed wafer to cleave along the region of the hydrogen implant. Finally, a polishing step is required to smooth the cleaved SOI surface. A fairly high density of etch pit defects in the SOI wafer is reported. The seed wafer is considered reusable as a handle wafer.

In "High-Quality Epitaxial Layer Transfer (ELTRAN) by Bond and Etch-Back of Porous Si", IEEE Int. SOI Conf. Proc., Oct 1995, pp. 176–177, Sato et al. describe a bonded SOI process in which a porous silicon layer is formed on a seed wafer. A continuous epitaxial layer is deposited over the porous layer and the epitaxial layer is bonded to a handle wafer. The seed wafer is removed by grinding and finally the exposed porous silicon layer is removed by preferential etching. A high stacking fault density in the SOI layer, which was substantially reduced by high temperature annealing, is reported. The indicated thickness uniformity is quite good, but the seed wafer is destroyed by the process.

Another major SOI technique involves ion implanting oxygen into a semiconductor substrate to produce an insulating layer within the substrate. An isolated semiconductor layer of precise thickness uniformity is produced on full sized wafers, but the crystal defect density is relatively high. In addition, the bulk fixed charge density is usually excessive at the interface between the SOI layer and the insulating layer. Although the method is simple in principle, a recent paper estimates the cost to be about three times the cost of a conventional substrate. See "Advanced Manufacturing of SIMOX for Low Power Electronics", by Alles et al., Solid-State Electronics, Vol. 39, No. 4, pp. 499–504, 1996.

Both bonded and implanted SOI methods are thus far unable, on a practical manufacturing scale, to produce SOI layers to consistently meet the requirements of "fully depleted" SOI devices. Since fully depleted devices offer substantial advantages, a large portion of SOI applications are not adequately served by any present technology. It is clear both cost and quality improvements are still needed.

SUMMARY OF THE INVENTION

An object of the present invention is to provide a fabrication technique which will produce SOI layers of high quality for thickness uniformity, defect density, and interface charge density. A further object is to provide full size SOI wafers suitable for use in large volume manufacturing. A further object is to maintain the seed wafer in a condition suitable for reuse.

In order to achieve the above objects according to a first embodiment of the present invention, a pattern of trenches is etched into a seed wafer having first, second, and third regions. The trenched third region of the seed wafer is then bonded to a handle wafer. A selective etchant for the second region is introduced into the trenches at an edge of the bonded wafer pair by capillary action. Generally, the volume of the trenches is large compared to the volume of the second region of the seed wafer. Etching of the second region then proceeds laterally from the trenches, undercutting the bonded third region and separating the first region from the third region. The released third region can then be prepared for reuse as a new seed wafer or handle wafer.

In a second embodiment according to the present invention, the second region is partially etched to undercut the third region prior to bonding the handle wafer. The remaining volume of the second region is then substantially smaller relative to the trench volume, making complete removal of the second region after bonding more readily achievable.

In a third embodiment according to the present invention, etching of the second region is carried out at elevated pressure to suppress bubble formation by reaction products in the undercuts and trenches. Suppression or termination of etching due to bubbles is thereby avoided.

In a fourth embodiment according to the present invention, the second region is cleaved or fractured instead of, or in addition to, being selectively etched. Any portion of the second region remaining on the SOI layer after cleaving can be removed by further etching or polishing. Force to cleave the second region includes, but is not limited to, pressure of etch reaction products in the trenches and undercut regions.

Figure 1:
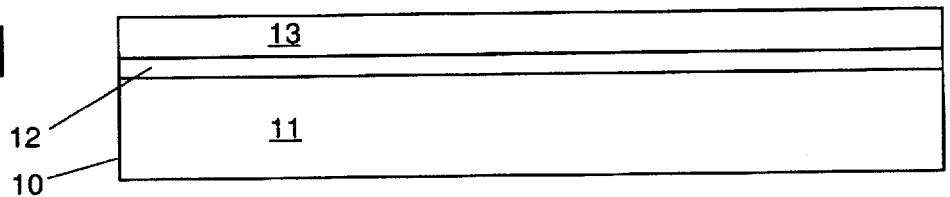
FIG. 1 is a cross section of a seed wafer.

REFERENCE NUMERALS IN THE DRAWINGS 10 seed substrate wafer
11 first region of a seed wafer
12 second region of a seed wafer
13 third region of a seed wafer
14 trench in a seed wafer
15 handle wafer
16 SOI wafer
20 oxide layer
21 silicon oxide sidewall spacer
22 silicon nitride sidewall spacer
23 silicon oxide
30 a first level in a seed wafer
31 a second level in a seed wafer

DETAILED DESCRIPTION OF THE PREFERRED EMBODIMENTS

The semiconductor on insulator fabrication method of the present invention comprises four basic steps:

(a) Providing a seed substrate having first, second, and third regions.
(b) Forming a groove in the substrate, thus providing an option to selectively etch the second region and undercut the third region. Groove formation can precede, follow, or be part of, definition of the three regions.
(c) bonding a handle substrate to the third region.
(d) removing and/or fracturing the second region, thus separating the first region from the third region.

FIG. 1 illustrates a cross section along a diameter of a conventional semiconductor seed substrate wafer 10 having a first region 11, a second region 12, and a third region 13. The relative thicknesses shown for regions 11, 12, and 13 are only illustrative, and do not represent preferred proportions. Regions 11, 12, and 13 may be of one uniform material, or they may each be of a different material, or any of them may be of a complex structure having multiple sub regions. Regions or sub regions need not necessarily be of uniform composition or thickness across the seed wafer.

Figure 2A:
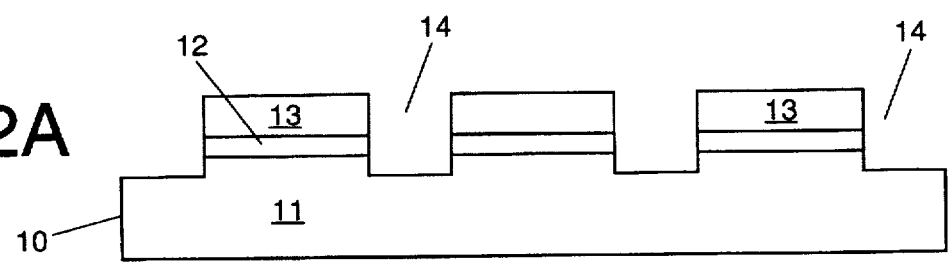
FIG. 2A is a cross section of a seed wafer after trench formation.
Figure 6:
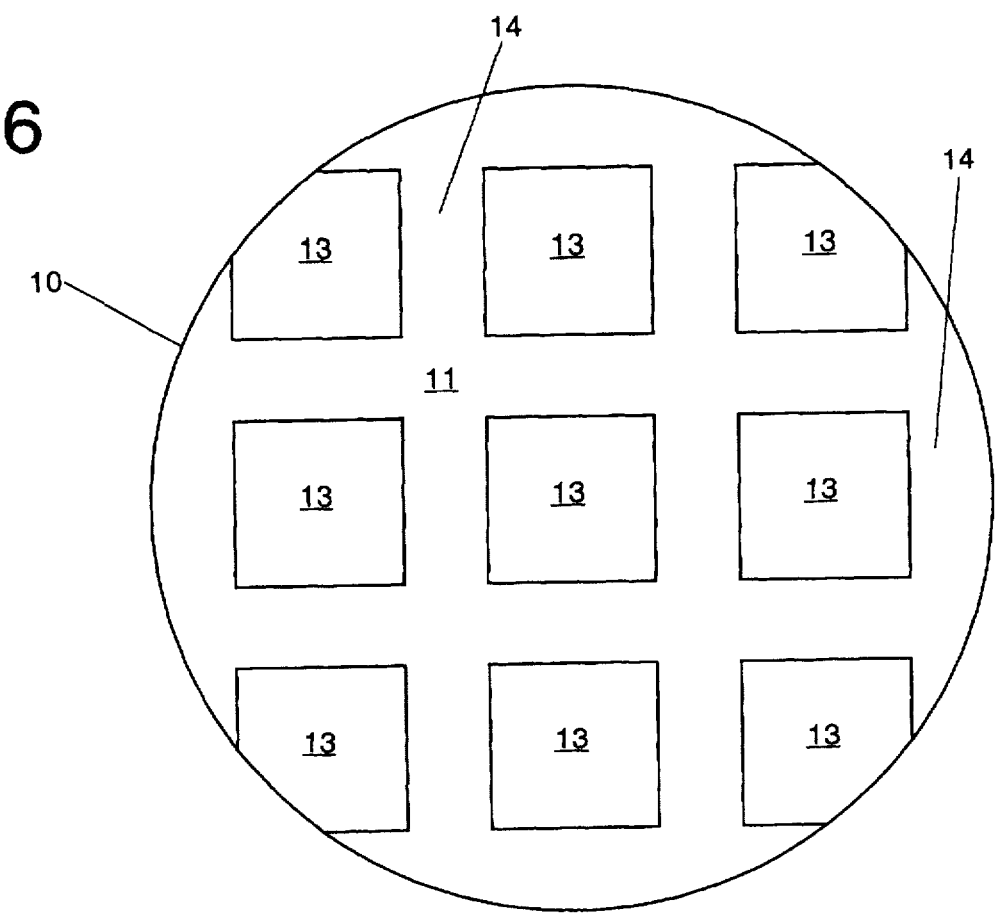
FIG. 6 shows a top view of the trenched seed wafer of FIG. 2A.

FIG. 2A shows trenches 14 etched in the seed wafer. The number and proportion of trenches shown are only illustrative, and are not intended to be preferred configurations. In addition, the trenches may be arranged in a two dimensional pattern when viewed from above the wafer. FIG. 6 is an illustrative top view of a seed wafer 10 with a grid of trenches. Preferably, the trench pattern is designed to also serve as the "isolation" pattern that is typically applied to SOI wafers later during device fabrication, thus saving a mask step. Trenches penetrate the third region, and may also penetrate the second and first regions, depending on considerations to be discussed in detail later. In FIG. 2A the trenches penetrate all three regions so as to maximize the volume of the trenches relative to the remaining portion of the second region. Such maximization may not always be necessary, depending on the considerations discussed later. Multiple trench dimensions may also be used, for example, wider and deeper trenches placed less frequently across the seed wafer than smaller trenches. Trenches of different sizes may intersect, allowing larger trenches to act as supply routes to distribute etchant to smaller trenches.

Figure 3A:
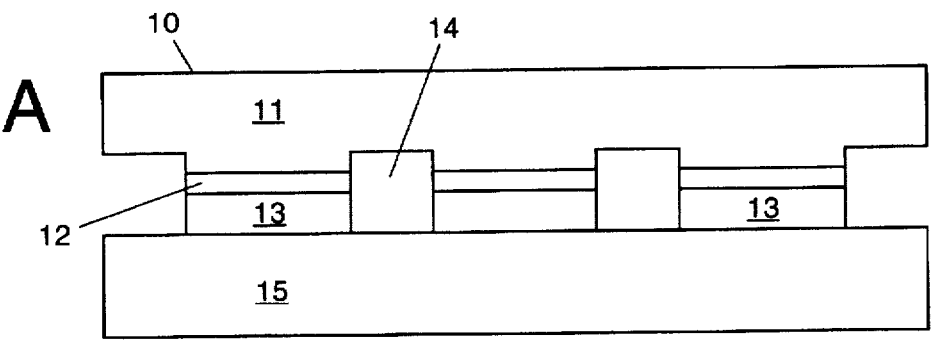
FIG. 3A shows the seed wafer bonded to a handle wafer.

FIG. 3A shows seed wafer 10 bonded to a handle wafer 15. Any suitable known bonding process can be used. The handle wafer can be of uniform composition or have a complex sub structure. In FIG. 3A the bonded seed wafer 10 is shown inverted relative to FIG. 1, as is conventional in SOI illustrations. After bonding, the trenches at the interface between the seed and handle wafers comprise a network of capillaries.

A liquid etchant selective for region 12 is introduced into the trenches from an edge of the wafer using capillary action. Etchant will fill the trenches if it contacts at one end of the trenches and is drawn thru the trenches by capillary action, thus avoiding trapping of air. Alternatively, the etchant can be brought into contact with the bonded wafer pair in a low pressure or evacuated vessel.

Filling of the trenches with selective etchant will be enhanced if the chosen etchant wets the relatively slowly etching capillary surfaces in addition to wetting region 12. To promote capillary action the contact angle of the etchant should be less than 90 degrees. See "Epitaxial Layer Transfer by Bond and Etch Back of Porous Si", Yonehara et al., Appl. Phys. Lett. 64 (16), Apr. 18, 1994, pp. 2108–2110 and also "Epitaxial Growth on Porous Si for a New Bond and Etchback Silicon-on-insulator", Sato et al., J. Electrochem. Soc., Vol. 142, No. Sep. 9, 1995, pp. 3116–3122, the contents of which are incorporated herein by reference. In his FIG. 12, Sato illustrates uniform etched enlargement of silicon pores of about 20 µm depth and 10 nm initial diameter, an aspect ratio of about 2000:1. This is a vivid demonstration of uniform etching all the way to the end of long capillaries, based on capillary transport. The porous silicon structure does not appear to trap air even though the pores are closed at one end.

Figure 4:
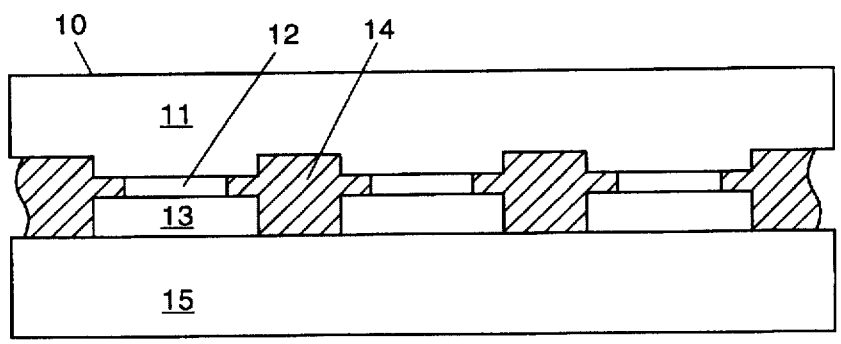
FIG. 4 shows bonded wafers during etching by capillary action.

FIG. 4 shows the bonded wafer pair during etching after a portion of region 12 has been consumed. Etchant filled features are shown hatched. If trenches 14 are closely enough spaced, and of sufficiently large volume relative to region 12, the reservoir of etchant in the trenches will be sufficient to fully consume region 12, and thereby disconnect region 11 from region 13. Thus, diffusion or circulation of etchant from the edge of large wafers is unnecessary after filling the trenches by capillary action. If reaction products form bubbles, the etching may be stopped in the vicinity of the bubbles. The volume of trenches 14 relative to the volume of region 12 needed to keep volatile products in solution, and thereby prevent bubble formation, is very large. A rough estimate of the necessary volume ratio can be made as follows. Yablonovitch et al., referenced previously, assume 3 moles of hydrogen are formed per mole of release layer (region 12) consumed. A typical release layer may have a density of about 0.1 mole per cc. which therefore produces about 0.3 moles of hydrogen per cc. of region 12 consumed. The equilibrium solubility of hydrogen in water at zero degrees and one atmosphere of pressure is about $10^{-6}$ moles per cc. These rough values yield a volume ratio of 33000:1 as the minimum necessary to prevent hydrogen bubble formation. Volume ratios greater than about 1000:1 provide ample reactant to fully consume the region 12 material, even at less than one molar concentrations of reactant in the solvent, so prevention of bubbles is the limiting factor to be considered.

Yablonovitch et al., referenced previously, report using a release layer 2 nm thick. For the present invention, use of a 2 nm thick region 12, and trenches 1 µm wide by 10 µm deep placed in a square grid pattern, with 2.5 µm trench separations, yields a volume ratio of about 5000:1, which is insufficient to prevent bubble formation. Note etch reaction products and etchant very rapidly diffuse the less than 2 µm lateral distance between the etching front in region 12 and the reservoir of etchant in the trench, so equilibrium is established quickly. Note also, that typical thicknesses of regions 13 and 11 are 100 nm and 400 µm respectively, so 10 µm deep trenches are small compared to the thickness of region 11.

Figure 2B:
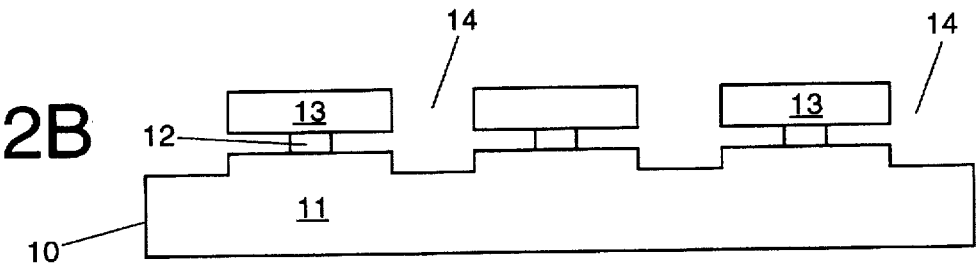
FIG. 2B shows a trenched seed wafer after undercut etching.
Figure 3B:
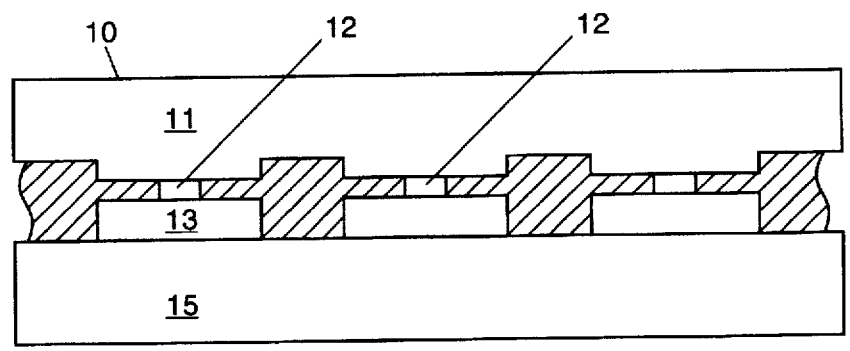
FIG. 3B shows a bonded undercut wafer.

The relative volume of trench (etchant) available to consume region 12 after wafer bonding can be increased by partially removing region 12 before bonding the wafers. This is shown before bonding in FIG. 2B where a portion of region 12 has been removed by selective etching, and after bonding in FIG. 3B, where the features to be filled with etchant by capillary action are hatched. Extending the numerical example above, if region 12 is removed about 0.85 µm laterally from each trench sidewall before bonding, then the volume ratio is increased by 10×, to become a 50,000:1 ratio, which is barely adequate to prevent bubble formation.

The etchant volume ratio needed to prevent bubble formation can be greatly reduced from 33,000:1 by etching at elevated pressure to enhance solubility of volatile reaction products. In "Treatise on Analytical Chemistry" edited by Kolthoff et al., Interscience Publishers Inc., 1961, p49, hydrogen solubility in water at zero degrees centigrade is given as 0.0214 cc/g at one atmosphere, 2.13 cc/g at 100 atmospheres, and 18 cc/g at 1000 atmospheres. Pressures of 10 to 100 atmospheres are readily achievable, and reduce the minimum volume ratio needed by 10× to 100×, thus providing ample margin in the above dimensional examples for bubble free etching. At 10 atmospheres, volume ratios substantially greater than 3300:1 will suffice, and at 100 atmospheres, volume ratios substantially greater than 330:1 are adequate. Page 53 of Kolthoff et al. indicates hydrogen solubility in alcohol to be about 4× higher than in water. Thus substantial further reduction of the minimum volume ratio is available thru use of solvents other than water. As will be indicated later, a KOH in alcohol etchant is appropriate for etching of region 12 for some materials.

Figure 5:
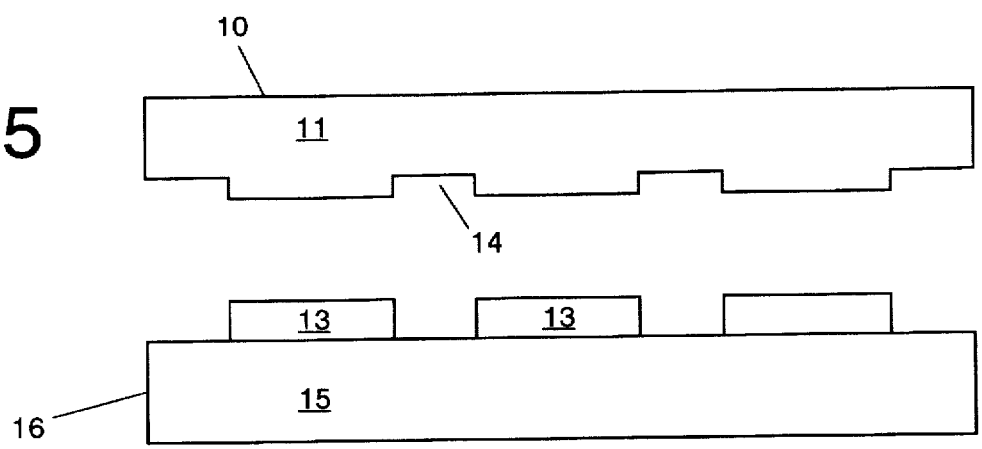
FIG. 5 shows the separated seed and SOI wafers.

FIG. 5 shows the separated SOI wafer 16, having handle wafer 15 and SOI layer 13. Also shown is the separated and generally reusable seed wafer 10, having residual region 11. To avoid cohesion between 10 and 16 due to surface tension, separation is best done while 10 and 16 are both immersed in etchant or solvent. Generally, it is preferred to repolish seed wafer 10 sufficiently to remove residual trenches 14 prior to reuse of 10 as a new seed wafer. The initial thickness of wafer 10 can be made large enough to allow for numerous repolishings and reuses.

As an example of materials and etchant suitable for use with the present invention, refer again to Yablonovitch et al. referenced previously. A complex stack of epitaxial GaAs and $Al_xGa_{1-x}As$ layers, represented by region 13 in the present invention, is lifted off by hydrofluoric acid (HF) undercut etching of an epitaxial AlAs release layer, represented by region 12 in the present invention. A GaAs seed substrate, represented by region 11 in the present invention, is used. After liftoff, Yablonovitch proceeds to bond the released stack to a suitable handle wafer. As indicated previously, mechanical problems in manipulating the thin stack limit the size of the seed wafer that can be used. The present invention overcomes this obstacle by bonding the stack to a handle wafer prior to liftoff, so that normal semiconductor wafer sizes can be processed. Hydrochloric acid (HCl) has been used as an alternative to HF by Dumke et al. in "GaAs-GaAlAs Heterojunction Transistor for High Frequency Operation", Solid State Electronics, Vol. 15, 1972, pp. 1339–1343. In the present invention, HCl may be preferred as an etchant when an HF soluble material such as silicon dioxide is present, and exposed, in the bonded structure.

As quantified in the dimensional examples above, the method of the present invention produces 2.5 µm square SOI islands covering about 50% of the handle wafer area in a grid pattern. The trench and SOI island dimensions chosen are only exemplary, and can be modified substantially. A 50% SOI island coverage of the handle wafer is within the normal range of "active" semiconductor area for practical integrated circuit design and construction. However, the percentage of island coverage, and island size and shape, can be substantially modified as necessary.

The material and etchant examples above use epitaxial material for regions 12 and 13. The selectivity of the etchant depends on the difference in composition between regions. Yonehara et al., and Sato et al., both referenced previously, illustrate another method suitable for establishing regions 11, 12, and 13. They construct a seed wafer stack of epitaxial silicon, corresponding to region 13 in the present invention, porous silicon, corresponding to region 12, and a silicon substrate wafer, corresponding to region 11. After bonding the stack to a handle wafer they destructively grind away region 11, and use an HF(3%)-$H_2O_2$(25%) solution to selectively remove the porous silicon (region 12) from region 13. The seed wafer is thus consumed by the process. Utilization of the present invention allows region 11 of the seed wafer stack to be kept intact for reuse.

Another method suitable to form a seed wafer stack for use with the present invention is described by Tsao et al. in "Selective Porous Silicon Formation in Buried P+Layers," J. Appl. Phys. 62 (10), Nov. 15, 1987, incorporated herein by reference. Porous silicon is electrolytically formed in P+material after deposition of an epitaxial layer. The porous silicon thus formed is located between the epitaxial layer and the seed substrate. Using the epitaxy as region 13, the porous silicon as region 12, and the seed substrate as region 11, the present invention can be applied to produce SOI material.

Non epitaxial seed material can also be used with the present invention. Kemlage et al. in "Total Dielectric Isolation," IBM Technical Disclosure Bulletin, Vol. 24, No. 11B, April 1982 describe a method for forming horizontal trenches extending laterally from vertical trenches in <111> oriented silicon. A pyrocatechol solution or a KOH in alcohol solution is used to etch the horizontal trenches. The etch ants are selective to crystal orientation, and attack the <111> surfaces very slowly compared to other major surfaces. The horizontal trench etching method of Kemlage et al. can be used in conjunction with appropriate process steps to form the seed wafer structure in FIG. 7G, which is analogous to FIG. 2B. The structures of FIGS. 7F and 7G can both be used according to the present invention to make SOI material. Either pyrocatechol or KOH etchants can be used for forming the structure of FIG. 7G, and for the etch step after bonding to complete removal of region 12 according to the present invention.

Figure 7A:
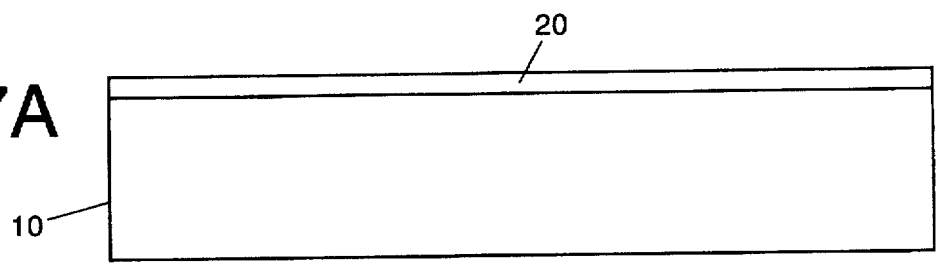
FIGS. 7A–7G show stages of a preferred method according to the invention.

The seed wafer structures of FIGS. 7F and 7G can be prepared as follows. FIG. 7A illustrates a cross section along a diameter of a seed wafer 10 having a silicon oxide layer 20. Wafer 10 can have a complex structure, but is assumed in the following to be a simple silicon wafer of <111> crystal orientation. Initially, there are no defined regions 11, 12 or 13 in seed wafer 10 of FIG. 7A. Subsequent processes will effectively define such regions, however, even if 10 is silicon of uniform composition and doping.

Figure 7B:
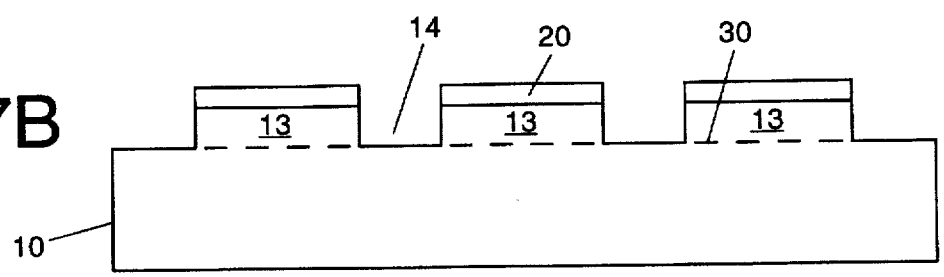
Figure 7C:
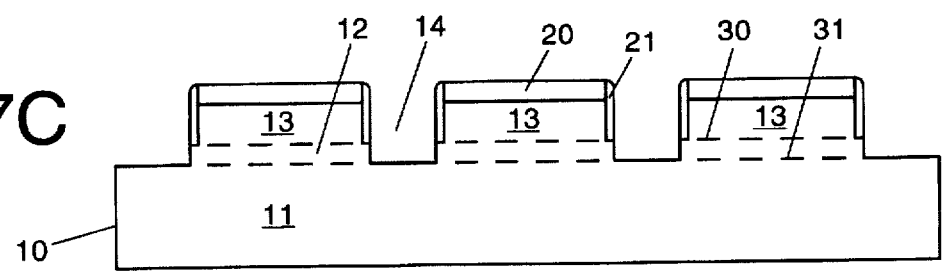

Referring to FIG. 7B, a conventional lithographic mask is applied to wafer 10 to define a trench pattern. Trenches 14 are directionally etched by well known means to a first predetermined depth in wafer 10. The bottom of the trench defines a first boundary level 30 within wafer 10, shown as horizontal dashed lines in FIG. 7B. Silicon material above the dashed lines is defined as region 13 as it pertains to the present invention. Next, a conformal layer of silicon oxide is deposited over the wafer and selectively reactive ion etched (RIE) to form oxide sidewall spacers 21 shown in FIG. 7C. Silicon RIE etching is then done to deepen trenches 14 to a second predetermined depth below the bottom edges of the sidewall spacers. The deeper trench bottom level defines a second boundary level 31 within wafer 10 which is also shown as dashed horizontal lines in FIG. 7C. Silicon material above the second boundary level and below the first boundary level is defined as region 12 as it pertains to the present invention. In the extreme, the deepening of trenches 14, and the corresponding separation between levels 30 and 31, can be reduced to zero, but a finite separation is generally preferred. In the case of zero separation, region 12 is defined as material immediately adjacent the merged levels. Silicon material below region 12 is defined as region 11.

Figure 7D:
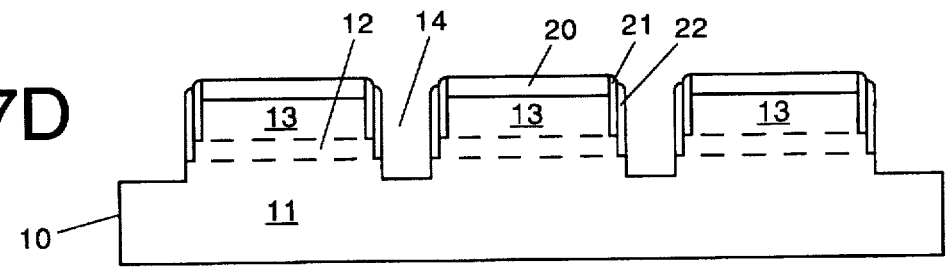
Figure 7E:
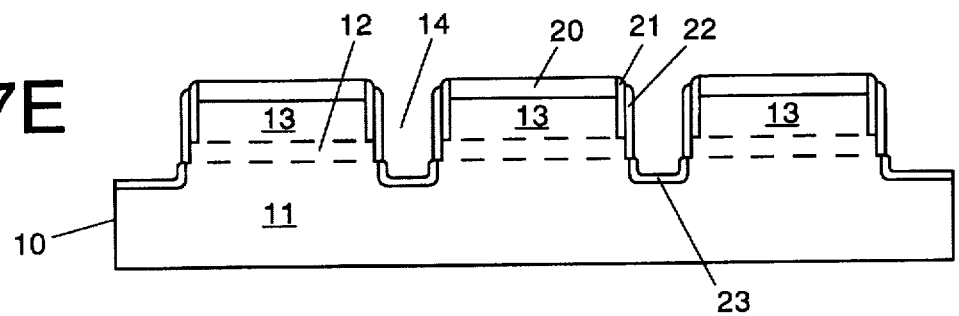
Figure 7F:
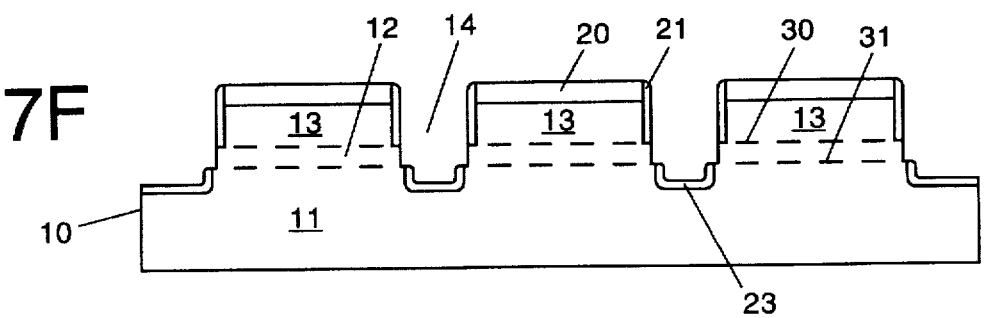
Figure 7G:
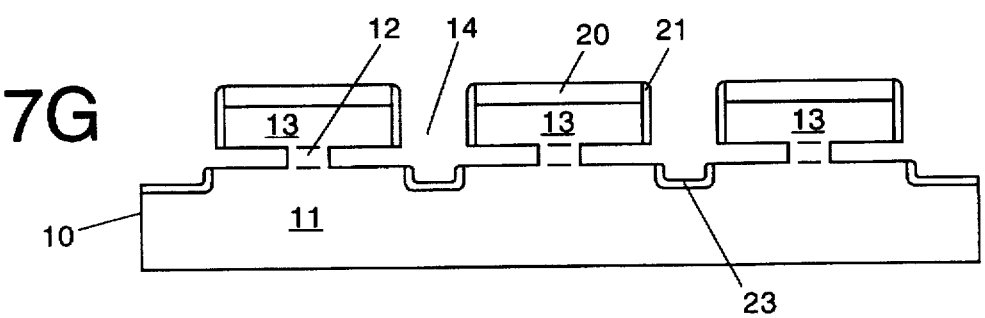

A silicon nitride layer is conformally deposited over the wafer and selectively RIE etched to form nitride sidewall spacers 22 shown in FIG. 7D. Silicon RIE etching is then done to further deepen trenches 14 to a third predetermined depth below the bottom of spacers 22. Again, in the extreme, the third deepening can be reduced to zero, but in general a finite deepening is preferred. A thermal oxidation of the silicon is then done to form silicon oxide layer 23 in the trench bottoms as shown in FIG. 7E. The relative portion of trench 14 lined by oxide 23 is made small for purposes of illustration, and may actually be a major portion of the trench depth in order to provide enough etchant to prevent bubble formation.

Nitride spacers 22 are then selectively removed using an appropriate etchant such as hot phosphoric acid. The resulting structure is shown in FIG. 7F, which is analogous to FIG. 2A as it applies to the present invention. The structure of FIG. 7F is bonded to an appropriate handle wafer and then region 12 is selectively removed by pyrocatechol or KOH solution etchant as described by Kemlage, referenced previously. Alternatively, regions 12 can be partially removed before bonding as shown in FIG. 7G, which is analogous to FIG. 2B as it applies to the present invention. In the extreme case in which levels 30 and 31 merge into a single level, a finite region 12 thickness is created by very slow attack of etchant on <111> and near <111> surfaces exposed by removal of nitride spacers 22. The technique of Kemlage, referenced previously, also depends on this small but finite etch rate. In the unusual situation in which an etchant has truly zero attack rate on <111> and near <111> surfaces, a finite separation between levels 30 and 31 must be maintained.

The method of FIGS. 7A–7G for seed wafer preparation is applicable to other materials than silicon. Many materials etch preferentially along crystalline directions. For example, germanium and gallium arsenide tend to etch more slowly on <111> surfaces in several etchants.

In "Thin Films of III–V Compounds and Their Applications," by Fan, referenced previously, an SOI cleaving, or fracturing, method is described. The method of the present invention probably results in inadvertent fracturing of residual portions of region 12 as etching of the region nears completion. Deliberate cleaving of region 12 can be used in addition to, or in lieu of, etching in the present invention. Seed wafer structures which are highly undercut prior to bonding of a handle wafer are particularly suitable for cleaving after bonding, even without any etching after bonding. The relatively small cross sectional strength of an undercut region 12 makes cleaving substantially easier than for structures that have not been undercut. In general, a separation by cleaving must be followed by an etch or polishing step to remove residual projections of region 12 material that extend above the SOI material.

As an alternative to cleaving as described by Fan, the present invention offers an opportunity after bonding to deliberately fracture a portion of region 12 by pressure of volatile etching products. Yablonovitch et al., referenced previously, reports fracturing of liftoff layers when undercut etch rate is too rapid, caused by the pressure of bubble formation in the narrow etching interface region. While the present invention has been discussed thus far in terms of preventing bubble formation, the etch can be tailored by trench and undercut dimensions, etchant composition, or temperature, so as to deliberately produce bubbles and fracture a residual portion of region 12. Use of etching and/or fracturing offers a generally wider process window than etching alone, by reducing or eliminating the minimum trench to region 12 volume ratio required. In the extreme, trenches 14 need not penetrate into region 11 at all.

While limited space prevents description here of all possible combinations of parameters suitable for use with the present invention, those skilled in the art will recognize such combinations can be used without departing from the spirit or scope of the present invention.

What is claimed is:

1. A method of forming a bonded structure comprising the steps of:
    (a) providing a seed substrate having first, second, and third regions;
    (b) forming a groove in said seed substrate;
    (c) bonding a handle substrate to said third region;
    (d) removing and/or fracturing said second region, whereby said first region is detached from the third region.

2. The method of claim 1 in which said groove extends into the second region.

3. The method of claim 2 in which said groove extends into the first region.

4. The method of claim 1 in which a portion of said second region is removed so as to undercut said third region prior to step (c).

5. The method of claim 1 further including use of the detached first region as a new seed substrate.

6. The method of claim 1 including etching the second region at elevated pressure.

7. The method of claim 1 in which a first sidewall spacer is used to define the thickness of the third region.

8. The method of claim 7 in which a second sidewall spacer is used to define the thickness of the second region.

9. A method of forming a bonded semiconductor on semiconductor structure comprising the steps of:
    (a) providing a seed substrate having first, second, and third regions;
    (b) forming a groove in said seed substrate;
    (c) bonding a handle substrate to said third region;
    (d) removing and/or fracturing said second region, whereby said first region is detached from the third region.

10. The method of claim 9 in which said groove extends into the second region.

11. The method of claim 10 in which said groove extends into the first region.

12. The method of claim 9 in which a portion of said second region is removed so as to undercut said third region prior to step (c).

13. The method of claim 9 further including use of the detached first region as a new seed substrate.

14. The method of claim 9 including etching the second region at elevated pressure.

15. A method of forming a bonded semiconductor on insulator structure comprising the steps of:
    (a) providing a seed substrate having first, second, and third regions;
    (b) forming a groove in said seed substrate;
    (c) bonding a handle substrate to said third region;
    (d) removing and/or fracturing said second region, whereby said first region is detached from the third region.

16. The method of claim 15 in which said groove extends into the second region.

17. The method of claim 16 in which said groove extends into the first region.

18. The method of claim 15 in which a portion of said second region is removed so as to undercut said third region prior to step (c).

19. The method of claim 15 further including use of the detached first region as a new seed substrate.

20. The method of claim 15 including etching the second region at elevated pressure.

\* \* \* \* \*